United States Patent [19]
Groechel et al.

[11] Patent Number: 5,021,121
[45] Date of Patent: Jun. 4, 1991

[54] PROCESS FOR RIE ETCHING SILICON DIOXIDE

[75] Inventors: David W. Groechel, Sunnyvale, Calif.; Brad Taylor, Seattle, Wash.; John R. Henri, Los Altos; Naomi Obinata, Mountain View, both of Calif.

[73] Assignee: Applied Materials, Inc., Santa Clara, Calif.

[21] Appl. No.: 481,135

[22] Filed: Feb. 16, 1990

[51] Int. Cl.$^5$ ............... B44C 1/22; C03C 15/00; C03C 25/06

[52] U.S. Cl. ................... 156/643; 156/644; 156/646; 156/657; 156/659.1; 204/192.37; 252/79.1; 437/238

[58] Field of Search ............... 156/643, 644, 646, 653, 156/657, 659.1, 662; 252/79.1; 427/38, 39; 204/192.32, 192.37; 437/238

[56] References Cited

U.S. PATENT DOCUMENTS

| | | | |
|---|---|---|---|
| 4,511,430 | 4/1985 | Chen et al. | 156/643 |
| 4,668,338 | 5/1987 | Maydan et al. | 156/643 |
| 4,680,087 | 7/1987 | Bobbio | 156/643 |
| 4,698,128 | 10/1987 | Berglund et al. | 156/643 |
| 4,711,698 | 12/1987 | Douglas | 252/79.1 X |
| 4,842,683 | 6/1989 | Cheng et al. | 156/345 |
| 4,904,341 | 2/1990 | Blaugher et al. | 252/79.1 X |

OTHER PUBLICATIONS

Roth et al., "In Situ, Tapered Contacts Etch", *Extended Abstract* (Electrochemical Society, Inc.), vol. 87-2, Sep. 1, 1987.

Primary Examiner—William A. Powell
Attorney, Agent, or Firm—Paul L. Hickman; John P. Taylor

[57] ABSTRACT

An improved RIE process is disclosed for etching one or more openings in a layer of an oxide of silicon on a semiconductor wafer characterized by a contact angle of at least 80°, with respect to the plane of the oxide layer, and highly selective to silicon which comprises flowing an inert gas and $CHF_3$ into an RIE chamber while maintaining respective gas flows within a range of from about 15 to about 185 sccm of inert gas and from about 15 to about 60 sccm of $CHF_3$, with a total gas flow not exceeding about 200 sccm, and a ratio of inert gas to $CHF_3$ ranging from about 1:1 to about 10:1. A plasma is maintained in the RIE chamber during the gas flow at a power level within a range of from about 400 to about 1000 watts. In a preferred embodiment, $CF_4$ gas is also flowed into the RIE chamber within a range of from about 1 to about 10 sccm to control the selectivity of the etch to silicon, and the wafer is immersed in a magnetic field of 1 to 120 gauss during the etching process.

20 Claims, 6 Drawing Sheets

FLOWING A MIXTURE OF FROM 30 TO 90 SCCM INERT GAS, 25 TO 35 SCCM $CHF_3$, AND 1 TO 10 SCCM $CF_4$ INTO AN RIE CHAMBER TO PROVIDE AN ETCH GAS MIXTURE HIGHLY SELECTIVE TO SILICON

IGNITING A PLASMA IN THE RIE CHAMBER OF FROM ABOUT 400 TO 1000 WATTS DURING THE GAS FLOW TO ETCH OPENINGS IN A SILICON OXIDE LAYER ON A SEMICONDUCTOR WAFER IN THE CHAMBER

IMMERSING THE WAFER DURING THE ETCH IN A MAGNETIC FIELD HAVING A MAGNETIC MOMENT PARALLEL TO THE PLANE OF THE WAFER BEING ETCHED

RECOVERING A WAFER HAVING ETCHED OPENINGS WITH SIDE WALLS NEARLY VERTICAL TO THE PLANE OF THE WAFER

Figure 1

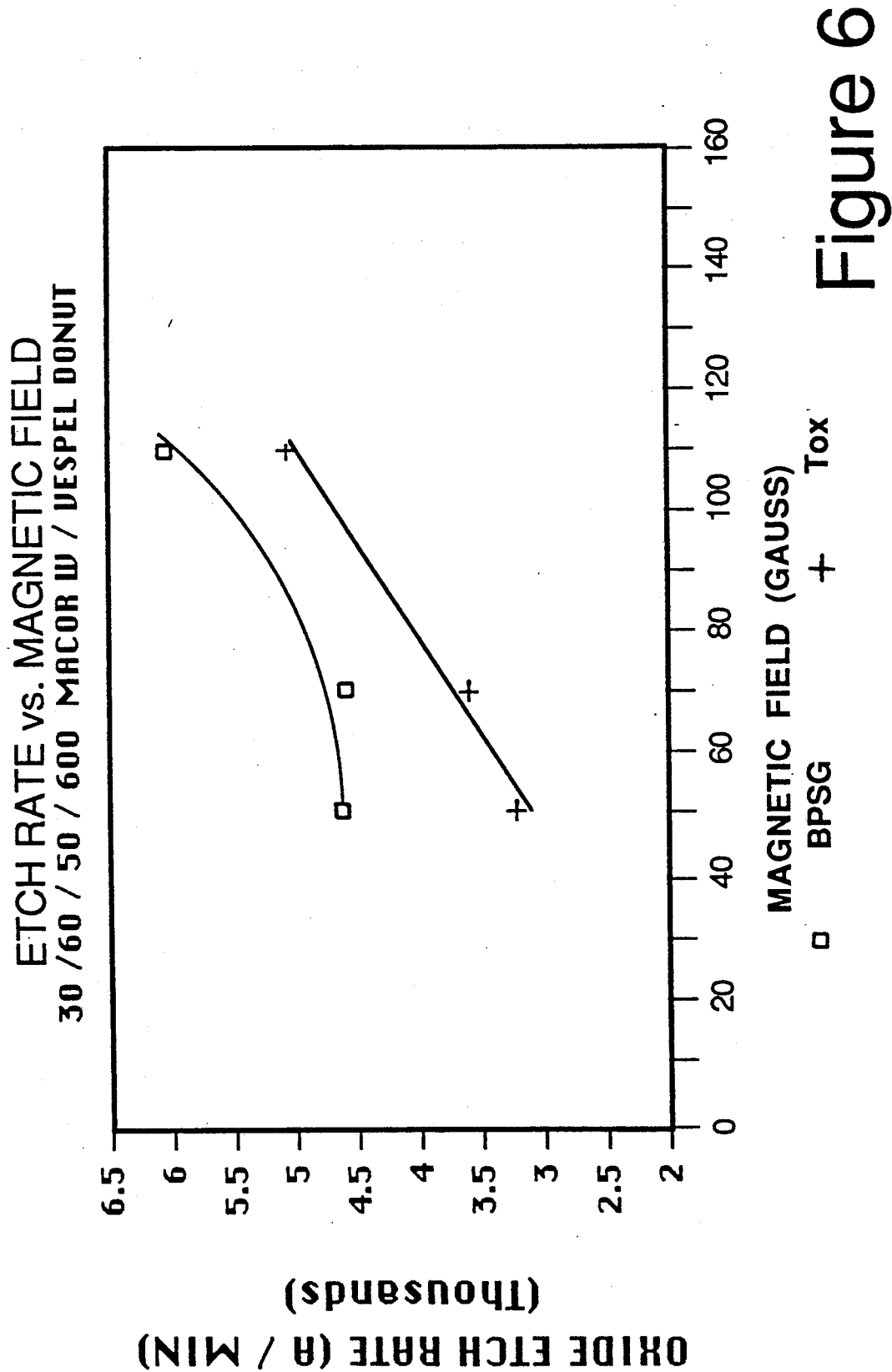

PROCESS FOR RIE ETCHING SILICON DIOXIDE

BACKGROUND OF THE INVENTION

1. Field of the Invention

This invention relates to a process for etching silicon dioxide. More particularly, this invention relates to a process for selectively plasma etching silicon dioxide on a silicon semiconductor wafer which will anisotropically etch openings in the silicon dioxide having near vertical sidewalls while maintaining a high selectivity for silicon.

2. Description of the Related Art

In the etching of openings in a silicon dioxide layer, for example, over a silicon substrate or a polysilicon layer, it is known to use a mixture of argon, $CHF_3$, and $O_2$, in a plasma etch process to enhance resist faceting to achieve an in situ tapered contact etch.

Quite surprisingly, however, it has now been discovered that silicon dioxide can be etched to provide near vertical sidewalls, rather than a tapered opening, using an etch chemistry highly selective to silicon, i.e., one which will preferentially etch silicon dioxide rather than silicon, and wherein the amount of selectivity can be controlled by varying the chemistry while still providing a near vertical etch.

SUMMARY OF THE INVENTION

It is, therefore, an object of this invention to provide an improved process for plasma etching silicon dioxide characterized by a near vertical etch slope, or contact angle, and a high selectivity to silicon.

It is another object of this invention to provide an improved process for plasma etching silicon dioxide wherein a mixture of an inert gas and $CHF_3$ are used, without oxygen, to provide a near vertical etch slope, or contact angle, and a high selectivity to silicon.

It is a further object of this invention to provide an improved process for plasma etching silicon dioxide wherein a mixture of an inert gas, $CHF_3$, and $CF_4$ are used, without oxygen, to provide a near vertical etch slope, or contact angle, and a controllable selectivity to silicon.

These and other objects of this invention will become apparent from the following description and accompanying drawings.

BRIEF DESCRIPTION OF THE DRAWINGS

FIG. 1 is a flow sheet illustrating the invention.

FIG. 6 is a graph depicting the oxide etch rate versus the strength of the magnetic field in the etching chamber.

DETAILED DESCRIPTION OF THE INVENTION

The invention comprises an improved process for the plasma etching of an oxide layer on a semiconductor wafer using a combination of an inert gas and $CHF_3$ to provide an oxide etch process highly selective to silicon and which provides a nearly vertical etch slope or contact angle. The provision of small amounts of $CF_4$ in the gas flow permits control of the selectivity of the etch process to silicon.

By use of the term "highly selective to silicon" herein is meant an oxide etch in which the etch ratio of oxide to silicon is at least 15 to 1, up to as high as 27 to 1, depending upon the amount of $CF_4$ present as will be described below.

By use of the terms "nearly vertical etch slope" or "nearly vertical contact angle" is meant an angle defined by the sidewall of the opening being formed of at least 80°, preferably about 90°, with the plane of the oxide layer being etched.

While the process of the invention is defined herein as a process for etching silicon dioxide ($SiO_2$), it will be understood that the silicon dioxide etched by the process, sometimes also referred to herein as "oxide" or "glass", need not be pure $SiO_2$, but may include other compounds therein, such as, for example, boron, phosphorus, or arsenic compounds, added to lower the melting or flow point of the glass or to impart other desired properties to the glass.

The etching apparatus used in carrying out the process of the invention may comprise any commercially available reactive ion etching (RIE) apparatus, or magnetically enhanced reactive ion etching (MERIE) apparatus, capable of supporting a wafer of the size desired to be etched in which gases of the type used herein may be introduced at the flow rates to be discussed and a plasma maintained at the power levels required for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; and the Quad reactive ion etcher by Drytek.

Figure 2:
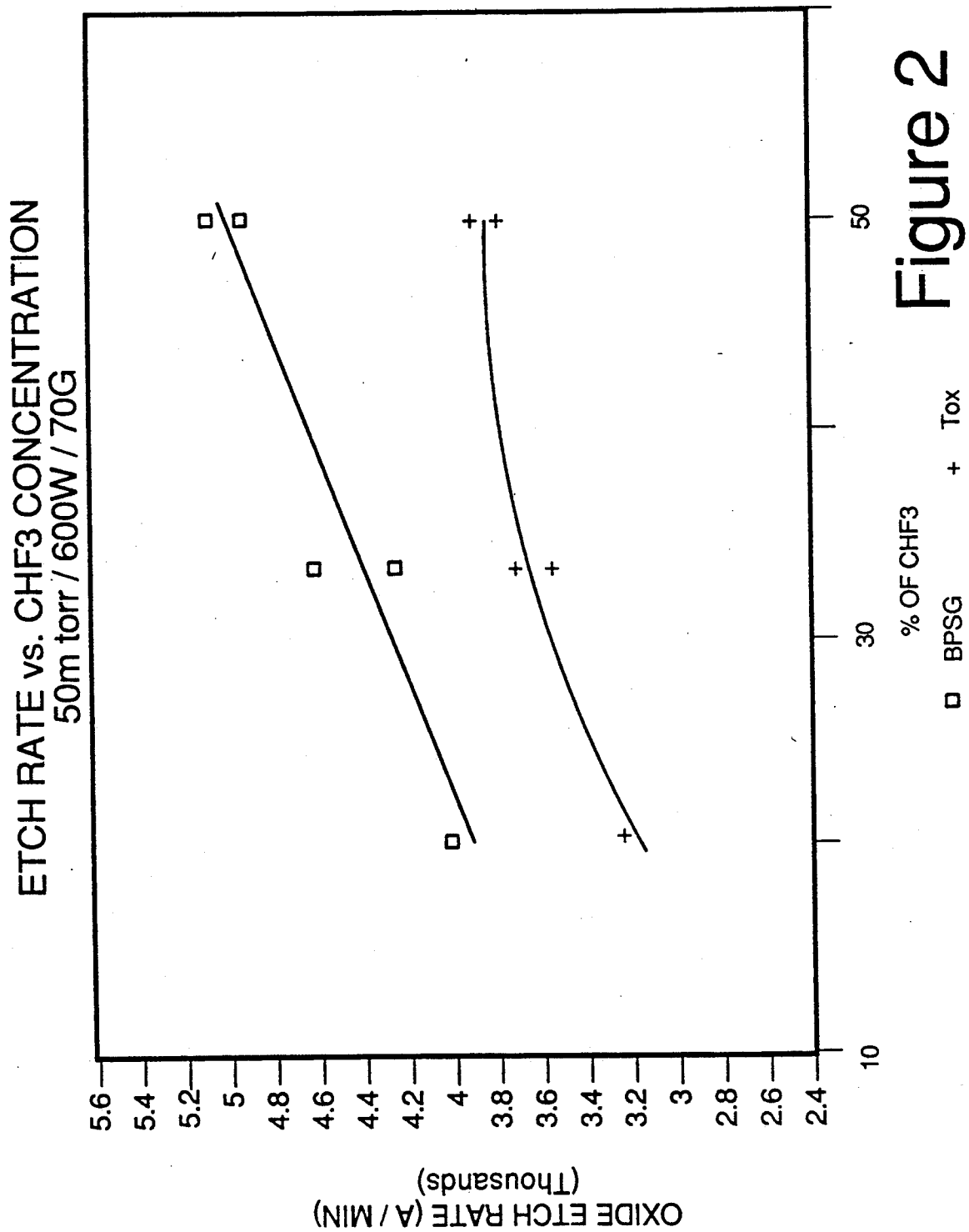
FIG. 2 is a graph depicting the oxide etch rate versus $CHF_3$ concentration plotted as a percentage of the total amount of inert gas and $CHF_3$ flowing into the etching chamber.

In accordance with a preferred embodiment of the invention, the amount of $CHF_3$ which is flowed through the RIE chamber during the etch varies within a range of from about 15 standard cubic centimeters/minute (sccm) to about 60 sccm, depending upon the size of the wafer and the desired etch rate. The graph of FIG. 2 shows the relationship between the flow of $CHF_3$ (expressed as a volume percentage of total $CHF_3$/inert gas flow versus the etch rate in Angstroms per minute for both a deposited boron phosphorus silicate glass (BPSG) and a thermally grown silicon dioxide (Tox) glass.

In addition, the ratio of the flow of inert gas to $CHF_3$ should be maintained within a range of from about 1:1 to about 10:1 to achieve an etch slope or contact angle of at least about 80°. Preferably the ratio of inert gas flow to flow of $CHF_3$ will vary from at least 2:1 to about 5:1 to achieve an etch slope or contact angle of at least about 85°.

Figure 3:
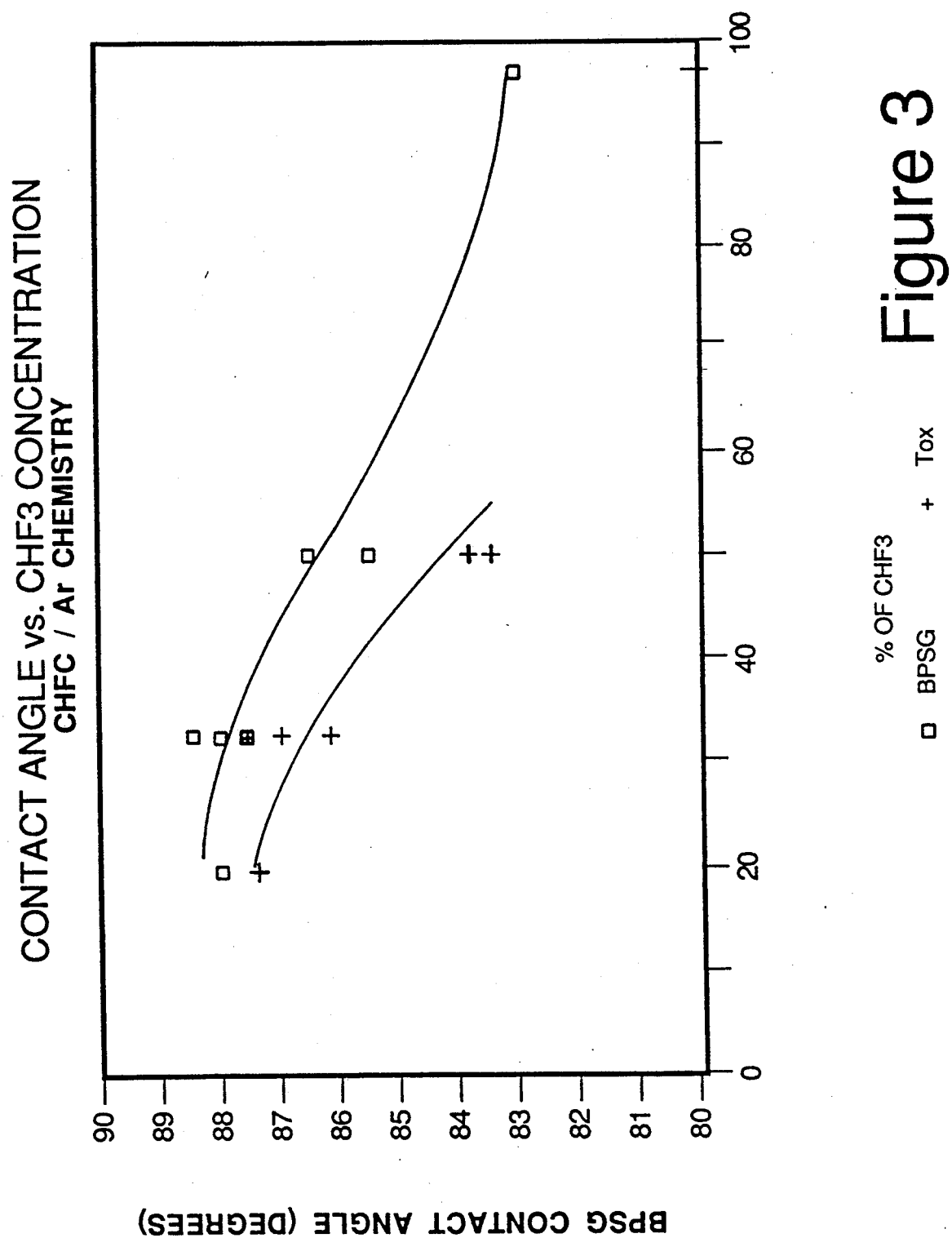
FIG. 3 is a graph depicting the contact angle of the etched opening versus $CHF_3$ concentration plotted as a percentage of the total amount of inert gas and $CHF_3$ flowing into the etching chamber.

It will be seen from the graph of FIG. 3 that the contact angle or slope of the etch will vary with $CHF_3$ concentration (shown in FIG. 3 as a volume percentage of the total inert gas/CHF$_3$ gas flow) with the highest angles being achieved when the CHF$_3$ concentration ranges from about 20 to 30 volume percent of the total inert gas/CHF$_3$ gas flow, i.e., a ratio range of inert gas to CHF$_3$ of from about 3.33:1 to about 5:1, with a higher angle achieved for a boron phosphorus silicate thermal oxide glass (BPSG) than for a (Tox) glass at the same concentration.

During the etch process, the pressure is maintained in the RIE chamber within a range of from about 10 milliTorr to about 120 milliTorr, preferably from about 40 milliTorr to about 80 milliTorr.

To achieve the desired ratio of inert gas to CHF$_3$, while still maintaining the RIE chamber within the desired pressure range, the total flow of gases into the RIE chamber should not exceed about 200 sccm. Therefore, the total amount of inert gas which is flowed into the RIE chamber at the same time as the CHF$_3$ will vary within a range of from about 15 sccm to about 185 sccm, and preferably from about 30 sccm to about 140 sccm. Preferably, in most instances, the inert gas comprises argon, but helium may also be used. However, in the instance of a layer of silicon dioxide over aluminum, the use of helium may be preferred, since argon may sputter the aluminum.

Figure 4:
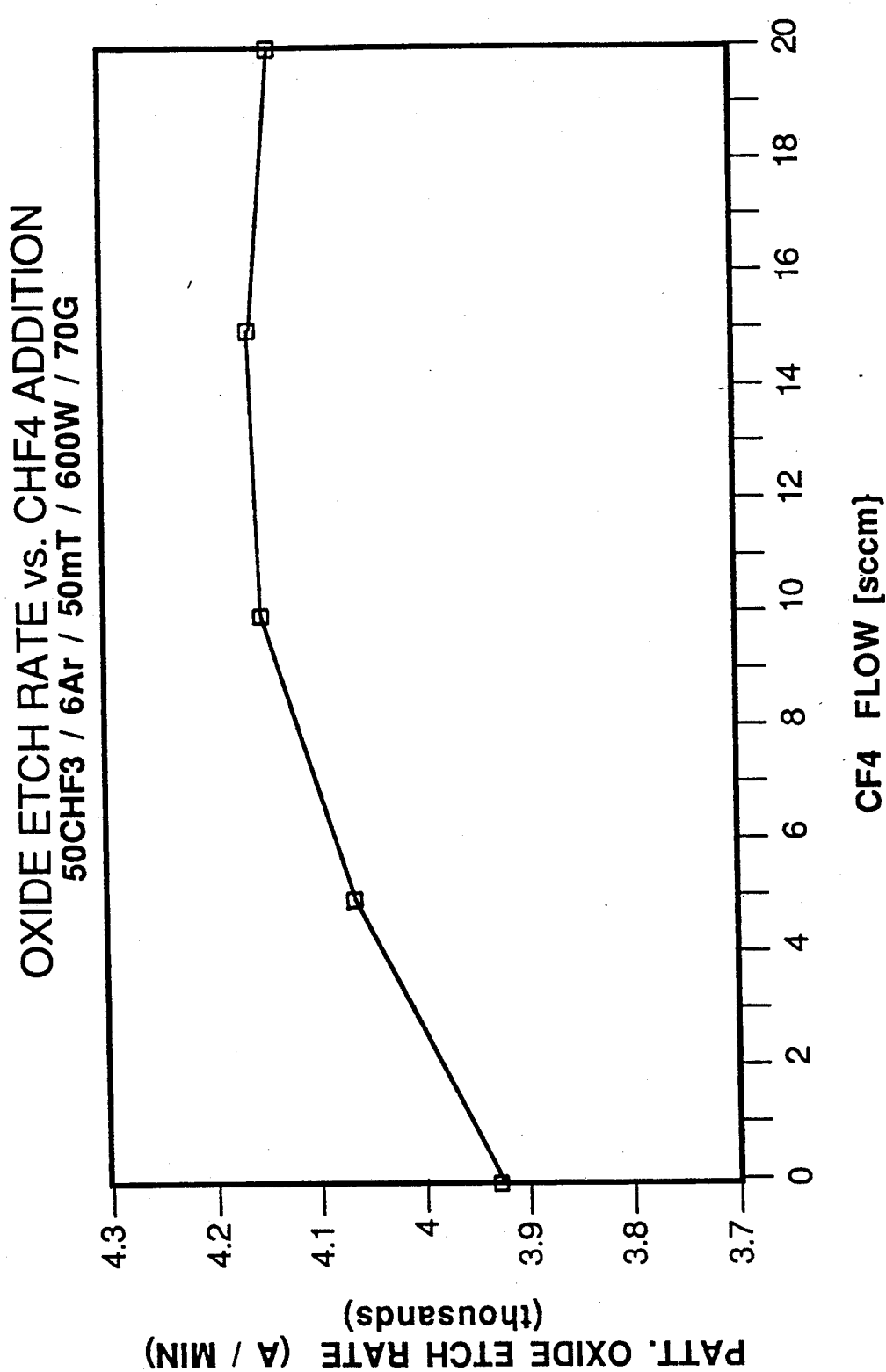
FIG. 4 is a graph depicting the oxide etch rate versus the amount of $CF_4$ flowing into the etching chamber.
Figure 5:
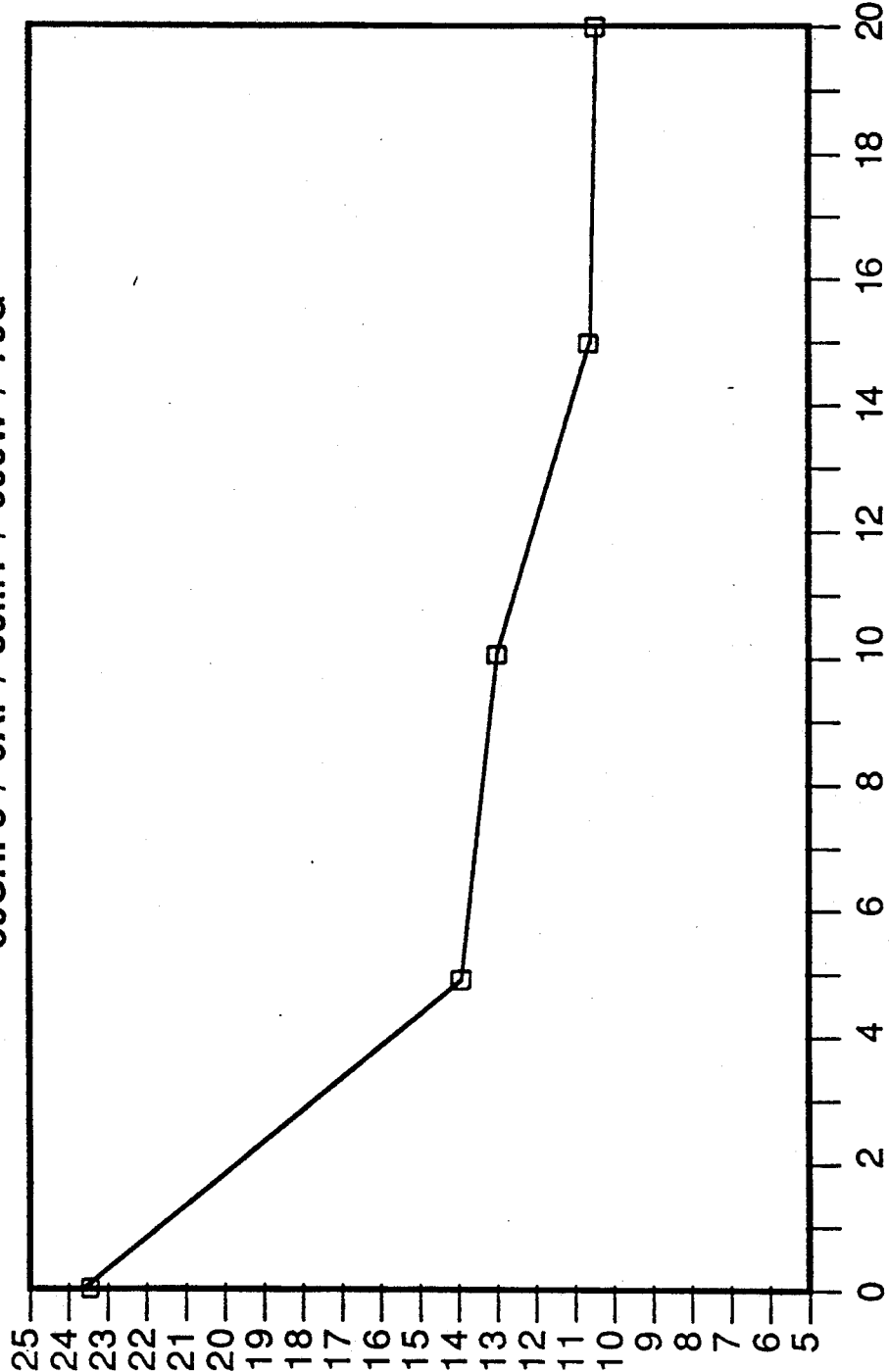
FIG. 5 is a graph depicting the selectivity of the etch to silicon plotted against the amount of $CF_4$ flowing into the etching chamber.

To control the selectivity of the etch to silicon, from about 1 up to about 10 sccm of CF$_4$ may also be flowed into the RIE chamber during the etch. Preferably, the amount of CF$_4$ flowed into the chamber will range from about 2 to about 6 sccm, and most preferably from about 2 to 5 sccm. The graph of FIG. 4 plots the oxide etch rate against the flow of CF$_4$, while the graph of FIG. 5 plots silicon selectivity versus CF$_4$ flow. It will be seen that the addition of CF$_4$ gas to the process increases the oxide etch rate while the selectivity to silicon is reduced as the amount of CF$_4$ in the gas flow is increased. Thus the use of CF$_4$ in the gas flow in accordance with the invention permits control of the amount of selectivity to silicon to provide more precise balancing of the oxide etch rate against silicon selectivity of the etch process.

The cathode on which the semiconductor wafer is mounted in the RIE chamber during the etch process is cooled down to, and maintained at, a temperature within a range of from about 15° C. to about 25° C., preferably about 20° C., to prevent heating of the wafer by the heat generated during the RIE process of the invention.

The walls of the RIE chamber and the showerhead through which the gases flow into the chamber are heated to a temperature within a range of from about 40° C. to about 50° C., for example, by flowing hot water through heat exchangers provided in the walls and showerhead.

The lid and other top surfaces of the RIE chamber are heated to a temperature within a range of from about 60° C. to about 90° C. to inhibit depositions on the top of the chamber which might then fall on the wafer. Resistive heaters are usually used to achieve this heating.

A plasma is ignited between the cathode on which the semiconductor wafer rests and the walls of the chamber using a power source which may be operated at a frequency of about 13.56 megahertz (MHz) and within a power range of from about 400 to about 1000 watts, depending upon the size of the wafer. For example, for a 4" wafer, the power level should be within a range of from about 400 to about 500 watts; for a 5" wafer, from about 600 to about 700 watts; for a 6" wafer, from about 650 to about 750 watts; and for an 8" wafer, from about 750 to about 1000 watts.

The RIE process of the invention is preferably operated in a magnetic field having a magnetic moment or direction of field strength lying in, or parallel to, the plane of the semiconductor wafer. The field strength of this magnetic field may range from 1 to about 120 gauss. The graph of FIG. 6 shows the oxide etch rate plotted against magnetic field strength.

Such a magnetic field may be provided by permanent magnets or by electromagnetic coils. In a preferred embodiment, magnetic field generating means, such as electromagnetic coils, are disposed around the RIE chamber and then suitably rotated or energized and deenergized to provide a magnetic field of rotating field strength with the magnetic axis rotating parallel to the plane of the wafer. Such a magnetic field enhanced RIE apparatus is described and claimed in U.S. Pat. No. 4,842,683, issued June 27, 1989, and assigned to the assignee of this invention, cross-reference to which is hereby made.

The RIE etch process of the invention may be more efficiently monitored for an end point by emission detection of a CO line, i.e. a 483 nm line, than prior art processes using oxygen gas in the etch gas flow, since the only source of oxygen in the process of the invention is in the oxide being etched, and thus the absence of such a CO line indicates that no further oxide is being etched, i.e., the end point has been reached.

While it is not desired to be bound by any particular theories of operation of the process, the CHF$_3$/inert gas system of the invention appears to be superior to an Ar/CHF$_3$/O$_2$ RIE process such as practiced in the prior art in providing an anisotropic etch of high selectivity to silicon. Plasma polymerization plays an important role when etching SiO$_2$ selectively to silicon. By forming selectively on the sidewalls of etch features, the polymer inhibits isotropic etching.

Results from a Ar/CHF$_3$/O$_2$ prior art process exhibit a thick polymer sidewall and tapered profiles, while results from the process of the invention exhibit a thin polymer sidewall and more vertical profiles. Although the process of the invention seems to decrease the rate of polymerization, it has increased the selective etching of thermal oxide in preference to silicon. During the etch, the horizontal surface remains free of polymer apparently due to a higher ion flux. However, the moment at which the silicon substrate is reached, a thin polymer film begins to form which inhibits further etching and thus enhances selectivity.

This effect appears to be the result of a decrease in the fluorine to carbon (F/C) ratio. The F/C ratio is the ratio of active species involved in etching SiO$_2$. Increasing the F/C ratio will increase the etch rate. Decreasing the ratio enhances polymer formation. The addition of O$_2$ to the inert gas/CHF$_3$ gas mixture (as practiced in the prior art) would effectively increase the F/C ratio since carbon is consumed in the formation of CO and CO$_2$. The fluorine is consumed at a lower rate in the formation of COF$_2$. In contrast, the process of the invention, the major source of oxygen is from the oxide being etched, thus the selectivity to silicon is enhanced due to the lower F/C ratio at the SiO$_2$/Si interface. The addition of CF$_4$ to the process provides further control and adjustment of the F/C ratio.

To further illustrate the invention, two 5" diameter silicon wafers, respectively having a 1 micron layer of thermally grown oxide (Tox) grown thereon, or a 1 micron layer of boron phosphorus silicate glass (BPSG) deposited thereon, with a photoresist pattern on each wafer having 0.8 micron diameter openings formed therein, were RIE etched in accordance with the process of the invention.

Each wafer was placed in the RIE chamber of an Applied Materials 5000 Series magnetically enhanced reactive ion etching system and 60 sccm of argon, 30 sccm of $CHF_3$, and 4 sccm of $CF_4$ were flowed into the chamber, while a vacuum of 80 milliTorr was maintained in the chamber. A plasma was ignited using a power level of 650 watts. The RIE etch was carried out while monitoring the 483 nm CO emission line. A magnetic field parallel to the plane of the wafer of 65 gauss was maintained during each etch.

When the reduction of the CO line intensity indicated that no further oxide was being etched, the plasma was extinguished, the gas flow shut off, and the electromagnets were turned off. The total etch time was noted in each case. The etch rate for the Tox-coated wafer was 3500 Angstroms/minute, while the etch rate for the BPSG-coated wafer was 4300 Angstroms/minute.

The cross-section of each of the etched wafers was examined using scanning electron microscopy (SEM) to determine the contact angle or slope of the openings as well as the extent of etching of the underlying silicon substrate. The average contact angle of the openings in the Tox-coated wafer was about 85°, while the average contact angle of the openings in the BPSG-coated wafer was about 87°.

Examination of the silicon wafers indicated that less than 100 Angstroms of the silicon wafer beneath either the Tox-coated or the BPSG-coated layers in the etched areas was etched away, indicating the high level of selectivity of the etch process of the invention.

Thus, the invention provides an improved silicon oxide etch process comprising an inert gas/$CHF_3$/$CF_4$ mixture in the absence of oxygen characterized by a nearly vertical contact angle and highly selective to silicon with the amount of selectivity controlled by the $CF_4$ and to maintain a good oxide etch rate.

Having thus described the invention, what is claimed is:

1. An improved RIE process for etching an oxide of silicon characterized by a nearly vertical contact angle and highly selective to silicon which comprises flowing from about 15 to about 185 sccm of an inert gas and from about 15 to about 60 sccm of $CHF_3$ into an RIE chamber while maintaining a plasma therein at a power level within a range of from about 400 to about 1000 watts.

2. The process of claim 1 wherein said step of flowing said inert gas and said $CHF_3$ gas into said RIE chamber further comprises flowing said gases into said chamber while maintaining a ratio between said gases within a range of from about 1:1 to about 10:1 of inert gas:$CHF_3$.

3. The process of claim 2 wherein the total flow of gases into said RIE chamber does not exceed about 200 sccm.

4. The process of claim 3 wherein said inert gas is selected from the class consisting of helium and argon.

5. The process of claim 4 wherein said inert gas comprises argon.

6. The process of claim 3 wherein said RIE chamber is maintained at a pressure during said etching within a range of from about 10 to about 120 milliTorr.

7. The process of claim 3 wherein the temperature of said wafer in said RIE chamber is maintained within a range of from about 15° C. to about 25° C. during said etching step.

8. The process of claim 3 wherein said wafer is immersed in a magnetic field during said etching step, said magnetic field having a field strength of up to 120 gauss and a magnetic moment in a direction parallel to the plane of said wafer.

9. The process of claim 3 wherein said step of flowing said gases into said chamber further comprises flowing $CF_4$ into said chamber in an amount within a range of from about 1 to about 10 sccm.

10. The process of claim 9 wherein said amount of said $CF_4$ gas into said chamber is within a range of from about 2 to about 6 sccm.

11. An improved RIE process for etching one or more openings in a layer of an oxide of silicon characterized by a contact angle of at least 80°, with respect to the plane of said oxide layer, and highly selective to silicon which comprises:

(a) flowing an inert gas, $CHF_3$, and $CF_4$ into an RIE chamber while maintaining said respective gas flows within a range of from about 30 to about 140 sccm of said inert gas, from about 15 to about 60 sccm of said $CHF_3$ and from about 1 to about 10 sccm of said $CF_4$, with the total amount of said gases not exceeding about 200 sccm; and (b) maintaining a plasma in said RIE chamber during said gas flow at a power level within a range of from about 400 to about 1000 watts.

12. The process of claim 11 wherein said step of flowing said gases into said RIE chamber further comprises flowing said gases into said chamber while maintaining a ratio between said inert gas and said $CHF_3$ within a range of from about 2:1 to about 5:1.

13. The process of claim 12 wherein said inert gas is selected from the class consisting of helium and argon.

14. The process of claim 12 wherein said wafer is immersed in a magnetic field during said etching step, said magnetic field having a field strength of up to 120 gauss and a magnetic moment in a direction parallel to the plane of said wafer.

15. The process of claim 12 wherein said amount of said $CF_4$ gas into said chamber is within a range of from about 2 to about 6 sccm.

16. An improved RIE process for etching one or more openings in a layer of an oxide of silicon characterized by a contact angle of at least 80°, with respect to the plane of said oxide layer, and highly selective to silicon which comprises:

(a) flowing argon, $CHF_3$, and $CF_4$ into an RIE chamber while maintaining said respective gas flows within a range of from about 30 to about 140 sccm of said argon, from about 15 to about 60 sccm of said $CHF_3$ and from about 2 to about 6 sccm of said $CF_4$, with the total amount of said gases not exceeding about 200 sccm, and while maintaining a ratio between said argon and said $CHF_3$ gases within a range of from about 2:1 to about 5:1;

(b) maintaining a plasma in said RIE chamber during said gas flow at a power level within a range of from about 400 to about 1000 watts; and (c) continuing to flow said gases into said chamber and maintaining said plasma in said chamber to etch said oxide of silicon until an underlying layer of silicon is reached.

17. The process of claim 16 wherein said wafer is immersed in a magnetic field during said etching step, said magnetic field having a field strength of up to 120 gauss and a magnetic moment in a direction parallel to the plane of said wafer.

18. The process of claim 16 wherein said RIE chamber is maintain at a pressure during said etching within a range of from about 10 to about 120 millitorr.

19. The process of claim 16 wherein the temperature of said wafer in said RIE chamber is maintained within a range of from about 15° C. to about 25° C. during said etching step.

20. An improved RIE process for etching one or more openings in a layer of an oxide of silicon characterized by a contact angle of at least 80°, with respect to the plane of said oxide layer, and highly selective to silicon which comprises:

(a) flowing argon, $CHF_3$, and $CF_4$ into an RIE chamber while maintaining said respective gas flows within a range of from about 30 to about 140 sccm of said argon, from about 15 to about 60 sccm of said $CHF_3$ and from about 2 to about 6 sccm of said $CF_4$, with the total amount of said gases not exceeding about 200 sccm, and while maintaining a ratio between said argon and said $CHF_3$ gases within a range of from about 2:1 to about 5:1;

(b) maintaining a plasma in said RIE chamber during said gas flow at a power level within a range of from about 400 to about 1000 watts;

(c) immersing said wafer in a magnetic field having a field strength of up to 120 gauss and a magnetic moment in a direction parallel to the plane of said wafer; and (d) continuing to flow said gases into said chamber and maintaining said plasma in said chamber to etch said oxide of silicon while immersed in said magnetic field until an underlying layer of silicon is reached.

* * * * *